United States Patent [19]

Moore

[11] Patent Number: 4,823,654
[45] Date of Patent: Apr. 25, 1989

[54] WAFER HANDLING TOOL AND METHOD OF USE

[75] Inventor: Gary M. Moore, San Jose, Calif.

[73] Assignee: Applied Materials, Inc., Santa Clara, Calif.

[21] Appl. No.: 154,166

[22] Filed: Feb. 8, 1988

[51] Int. Cl.⁴ .......................... B25B 33/00; B25F 1/00
[52] U.S. Cl. .......................................... 81/488; 7/170; 294/19.1; 29/270
[58] Field of Search ...................... 81/488; 7/170, 169; 294/19.1, 24, 26, 64.1, 64.3, 2; 29/743, 744, 270

[56] References Cited

U.S. PATENT DOCUMENTS

| | | | |
|---|---|---|---|
| 1,506,102 | 8/1924 | Wise | 7/170 |
| 4,034,595 | 7/1977 | Smith | 81/488 |
| 4,496,180 | 1/1985 | Hilton | 294/64.1 |
| 4,658,457 | 4/1987 | Rokita | 7/170 |

Primary Examiner—Roscoe V. Parker
Attorney, Agent, or Firm—Flehr, Hohbach, Test, Albritton & Herbert

[57] ABSTRACT

An IC-wafer handling tool comprising an aluminum handle, a detachable polyimid pointed end member and a detachable polyimid hook end member. The pointed end is used in cooperation with a vacuum pick to load wafers into susceptor pockets, and the hooked end is used in cooperation with a vacuum pick to unload wafers. During loading and unloading, the only contact with the front side of the wafer is at the edge of the wafer, which does not contain integrated circuit structure, thereby decreasing particulate contamination of the wafer and the associated IC structure on the wafer.

13 Claims, 1 Drawing Sheet

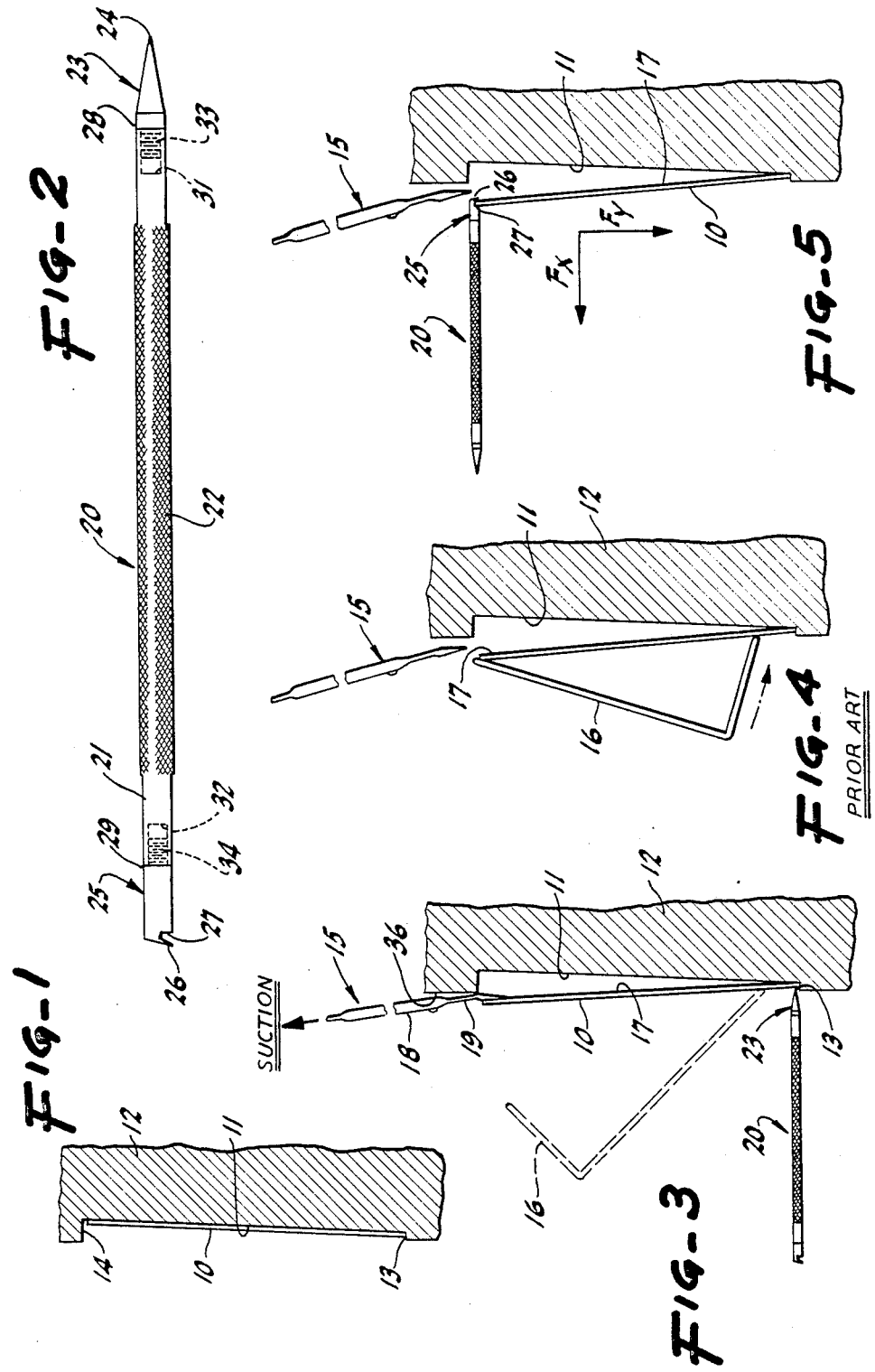

WAFER HANDLING TOOL AND METHOD OF USE

BACKGROUND OF THE INVENTION

The present invention relates to a tool, and to a method of using the tool, for depositing workpieces such as semiconductor wafers on process supports such as susceptors or electrodes and for removing the workpieces from such supports. In particular, the invention relates to a method of using the tool in cooperation with a vacuum pick-up tool to deposit and remove wafers with reduced particulate-generating contact at the front side of the wafers.

STATE OF THE PRIOR ART

The present invention relates to loading and unloading wafers from the front side or outside of vertically- and horizontally-oriented substrate supports such as the susceptors and electrodes used in semiconductor processing chambers. One such processing chamber is the AME 7810/20 epitaxial deposition reactor which is available from the assignee, Applied Materials, Inc., Santa Clara, Calif. Referring to FIG. 1, in that reactor, wafers 10 are supported at a slight angle to the vertical in shallow pockets 11 spaced about the periphery of a vertical susceptor 12.

In the prior art, the susceptors 12 and other wafer supports typically are loaded and unloaded manually using tweezers, L-shaped rods and/or vacuum picks. Tweezers grippingly engage both the front and the backsides of a wafer for transport, loading and unloading. L-shaped rods are used in conjunction with vacuum pick-up tools and cause perhaps the least amount of damage to wafers and generate the least amount of wafer-contaminating particulates of the wafer-handling techniques.

Referring to FIG. 3, during loading using an L-rod 16, the wafer 10 is transported by a vacuum pick 15 which engages the wafer 10 at its backside 17 and is used to move the wafer into position with its bottom edge on the lower lip 13 of the susceptor. Then, rod 16 is pressed against the bottom front side of the wafer 10 (as shown in phantom in FIG. 3), the wafer pick 15 is disengaged from the wafer 10, and the L-shaped rod is used to gently pivot the wafer into the pocket 11.

Referring to FIG. 4, to unload a wafer 10 from the pocket 11, the bottom of L-rod 16 is placed against the bottom of the front side of the wafer 10 and pressure is applied to the bottom of wafer 10, causing it to rock forward and rest against the top of the L-rod 16 a short distance away from the susceptor pocket 11. This allows the vacuum pick 15 to be inserted between the wafer 10 and the pocket 11 to pick up the wafer and remove it from the susceptor.

As is known, IC (integrated circuit) structure is not formed on an outside annulus of wafers which is about three millimeters wide. As a consequence, wafers can be contacted there with a minimum of particulate-induced damage to IC's on the wafer. (This is reflected in the so-called 3 mm industry standard for measuring particulates, which does not measure particulates in the outer, 3 mm wide annulus.) Although, as described above, the L-shaped rod 16 makes essentially point contact with the wafer, and presumably generates fewer particulates than would contact over a larger area, nonetheless the rod 16 also has the disadvantage of contacting the central IC region of the wafer, outside the safe narrow edge annulus.

Recently, a Low Defect System II$^{TM}$ version and retrofit of the above-mentioned AME 7810/20 system has been developed which is designed to provide an even greater level of particulate-free process cleanliness. To obtain the full benefit of such a system (or of the basic system), it is highly desirable to have a wafer handling device and method which generates, if at all, only very small amounts of particulates. Specifically, it is desirable to have a wafer handling device and associated method of use which do not result in contact of the wafer within the narrow, approximately three millimeter wide, edge annulus and therefore do not contact the IC structure on the wafer during loading and unloading.

SUMMARY OF THE INVENTION

In view of the above discussion, it is one object of the present invention to provide a wafer handling tool which engages wafers only at the edge thereof.

It is another object of the present invention to provide a wafer handling tool which is used in conjunction with a vacuum wafer pick to load wafers onto a susceptor and to unload wafers from the susceptor using only point contact of the edge of the wafer outside the IC region.

In one embodiment, the wafer handling tool of my present invention comprises an elongated body or handle of relatively lightweight material such as anodized aluminum. The handle may have a knurled or otherwise roughened region intermediate its ends to provide secure handling, and has threaded holes in the opposite ends. The wafer handling tool also includes a pointed end member which is screwed into one end of the handle. A cylindrical end member which is screwed into the opposite end of the handle comprises an angled end surface and a notch adjacent the end surface which defines a thin, flat hook for engaging workpieces such as wafers at their edge.

In another aspect, my present invention relates to a method of picking up work pieces such as wafers from a support such as a susceptor pocket using a wafer tool having a flat end hook and an adjacent notch, and comprises the steps: inserting the hook over the wafer proximate the upper edge thereof; pivoting the wafer outward away from the pocket using the bottom lip of the pocket as a pivot point; inserting a vacuum pick-up tool between the wafer and the pocket and engaging the backside of the wafer; then, using the vacuum pick, lifting the wafer from the pocket.

BRIEF DESCRIPTION OF THE DRAWINGS

The present invention is described with respect to the following drawings, in which:

FIG. 1 depicts a vertical susceptor pocket and a wafer positioned therein;

FIG. 2 is a side view of a wafer handling tool embodying my present invention;

FIG. 3 illustrates the use of the wafer handling tool depicted in FIG. 2 for loading a wafer onto a susceptor pocket and illustrates in phantom the prior art use of an L-shaped tool for this purpose;

FIG. 4 illustrates the prior art use of an L-shaped wafer handling tool and a vacuum pick to unload a wafer from a susceptor pocket; and FIG. 5 illustrates the use of the wafer handling tool of FIG. 2 in conjunction with a vacuum pick to unload a wafer from a susceptor pocket.

DETAILED DESCRIPTION OF THE INVENTION

FIG. 2 depicts a preferred embodiment of my wafer handling tool 20. The tool comprises an elongated, cylindrical, rod-like body or handle 21, a removable pointed end member 23, and a removable hooked end member 25. The body 21 is made of lightweight metal or other material such as aluminum, preferably has an anodized surface, and includes a knurled or a braided region 22 intermediate the opposite ends 28 and 29 which provides secure gripping. Threaded internal holes 31,32 (shown in phantom in FIG. 2) are formed in the opposite ends 28,29 for receiving mated threaded ends 33,34 of the pointed end member 23 and the hook end member 25, to permit removal and replacement of the end members 23,25.

The pointed end member 23 is made of high temperature (i.e., high softening, high melting point temperature), low particulate, inert material such as polyimid. Also, unlike material such as quartz, polyimid does not scratch semiconductor wafers. The end member 23 has a generally conical shape which terminates in point 24 and is used to hold the lower end of the wafer 10 on the narrow lower shelf 13 of susceptor pocket 11 during loading. See FIG. 3.

Referring again to FIG. 2, hooked end member 25 is also made of high temperature, low particulate, inert material such as polyimid and has a thin, flat, outwardly angled hook 26 and an adjacent transverse notch 27 which is preferably approximately two to three millimeters deep.

FIGS. 3 and 5 show the use of my wafer handling tool 20 in conjunction with a vacuum pick 15 for loading and unloading a wafer 10. Referring to FIG. 3, to effect loading, the wafer 10 is transported to the pocket 11 by the vacuum pick 15, which engages the wafer's backside 17. Those of usual skill in the art are familiar with the construction and operation of vacuum picks which, typically, comprise a hollow body 18 connected by a hose to a vacuum pump and a flat tip 19 having an opening for applying gripping suction to the wafer. Using the vacuum pick 16, the bottom edge of the wafer 10 is positioned on the relatively narrow bottom lip or shelf 13 of the susceptor pocket 11, then my wafer handling tool 20, specifically the pointed end 23 thereof, is applied gently against the bottom edge of the wafer, within the approximately 3 mm wide edge annulus, to hold the bottom of the wafer against the pocket. The vacuum pick 15 is then pivoted inwardly toward the susceptor, the vacuum is released and the pick is slid gently upwardly out of engagement with the wafer 10, allowing the upper end of the wafer to pivot gently into the backwardly angled susceptor pocket 11. Please note, the front surface 36 of the suseptor 12 is angled backwards slightly relative to the vertical (the suspexlar is smaller at the top than at the bottom) so that the top of the wafer 10 is angled backward when it is released by the pick 16, with the result that the wafer is urged into the pocket by gravity.

Referring now primarily to FIG.5, to remove a wafer 10 from susceptor pocket 11, the hooked end 25 of my wafer handling tool 20 is inserted between the top of the wafer 10 and the upper shoulder 14 of the susceptor pocket 11 and the notch 27 is slipped onto the top edge of the wafer so that the hook 26 is behind the wafer. The tool is then pressed gently downward against the top of the wafer to apply a force schematically illustrated as $F_y$ which holds the bottom edge of the wafer against the bottom lip 13 of the susceptor pocket 11. At the same time, the tool 20 is retracted from the susceptor pocket 11 in the direction $F_x$ so that the wafer pivots about its bottom edge. Vacuum pick 15 is inserted into the resulting space between the back 17 of the wafer and the upper lip 14 of the susceptor pocket and into gripping engagement with the wafer, and is then withdrawn from the susceptor pocket, completing unloading of the wafer.

During the loading and unloading sequences described above using my new wafer handling tool, the only contact with the front side of the wafer 10 is point contact by end 23, during loading, and contact by the notch 27 and hook 26, during unloading. Both points of contact occur within the three millimeter wide, safe edge region. This reduces particulates to levels which satisfy the above-described, stringent, low particulate, requirements.

The number of particulates greater than 0.3 micron in size and greater than 0.5 micron in size were measured on 100 mm diameter wafers after loading, epitaxial processing, unloading cycles using front-engaging robot loading/unloading; robot loading/tweezer unloading; tweezer loading/unloading; L-tool loading/unloading; loading/unloading using my new wafer handling tool 20. The same epitaxial process cycle was used for all measurements, i.e., for each type of loading and unloading method. The AME 7810 system fitted with the Low Defect System II ™ retrofit kit available from Applied Materials, Inc., Santa Clara, Calif., was used for the epitaxial processing. The Table gives particulate data for the above-described loading/unloading sequences:

Row A—particulates added due to robot loading prior to epitaxial processing;

Row B—typical, that is, average particulate levels resulting from the sequence robot loading, epitaxial processing, robot unloading;

Row C—best case robot handling, i.e., the lowest particulate levels achieved during the sequence robot loading, epitaxial processing, robot unloading;

Row D—particulate levels after the sequence robot loading, epitaxial processing, tweezer unloading;

Row E—particulate levels after the sequence tweezer loading, epitaxial processing, tweezer unloading;

Row F—particulate levels after the sequence L-tool loading, epitaxial processing, L-tool unloading; and Row G—particulate levels after the sequence hook tool 20 loading, epitaxial processing, hook tool 20 unloading.

TABLE

Summary of Particle Data

| | | Total Particles (particles/cm$^2$) | | | |
|---|---|---|---|---|---|
| | | 1 mm edge excl | | 3 mm edge excl | |
| | Test Sequence | >.3μ | >.5μ | >.3μ | >.5μ |
| (A) | Robot-Before Epi | 59(.70) | 37(.44) | — | — |
| (B) | Robot-After Epi TYPICAL | 206(2.5) | 82(.98) | 97(.15) | 35(.42) |
| (C) | Robot-After Epi BEST | 76(.90) | 36(.43) | 18(0.21) | 8(.10) |
| (D) | Robot Load-Tweezer Unload | 61(.73) | 38(.45) | 10(.12) | 3(.04) |
| (E) | Tweezer Load/Unload | 55(.66) | 38(.45) | 25(.29) | 18(.21) |
| (F) | "L" Push Rod | 32(.38) | 12(.14) | 16(.19) | 5(.06) |
| (G) | New Loading | 20(.24) | 16(.19) | 6(.07) | 3(.04) |

TABLE -continued
Summary of Particle Data

| | Total Particles (particles/cm²) | | | |
|---|---|---|---|---|
| | 1 mm edge excl | | 3 mm edge excl | |
| Test Sequence | >.3μ | >.5μ | >.3μ | >.5μ |
| Tool | | | | |

Ranking of Handling Method (Standard 3 mm edge exclusion):
(1) TOOL 20
(2) "L"Push Rod
(3) Robot - Best Data
(4) Tweezers
(5) Robot - Typical For the one millimeter edge exclusion data (i.e., particulates were measured everywhere on the wafer except a one millimeter-wide outside border), the new loading tool provides much fewer particulates of size greater than 0.3 micron than any of the other loading/unloading methods and provides fewer particulates of size greater than 0.5 micron than the other load/unload methods, except the L-push rod, which provide slightly better, but approximately equivalent results. The 0.5 micron results for the 1 mm edge exclusion standard are not surprising since my hooked wafer tool 20 is specifically adapted to the industry standard 3 millimeter edge exclusion. Moreover, one should not lose sight of the fact that, using the one millimeter edge exclusion standard, my hooked wafer tool 20 provided results far superior to the robot and the tweezer for both defect sizes, was far superior to the L-rod for the 0.3 micron range, and overall was superior to the L-rod.

Furthermore, using the industry standard three millimeter edge exclusion, my hooked loading tool 20 provided fewer measured particles of size greater than 0.5 micron, as well as fewer measured particles of size greater than 0.3 micron, than the prior art techniques. The only exception is the >0.5μ measurement using robot load/tweezer unload, which provided results equivalent to my hooked wafer tool 20. However, in overall performance (0.3μ and 0.5μ measurements), my new hooked tool 20 was decidely superior to the impractical robot/tweezer technique, which requires a large capital investment and manual handling. While we have described the use of my hooked tool 20 to unload and load wafers from a vertical susceptor, it can be used as well to load and unload horizontal and other non-vertical supports such as susceptors and electrodes. In horizontal systems, the load/unload operation is as described above, with the following exceptions. For loading, the tool 20 and the pick 16 are merely positioned at suitably spaced locations about the periphery of the wafer 10. For unloading, the tool 20 can be used to lift the wafer essentially anywhere about the wafer periphery where there is sufficient access to the edge of the wafer to permit pick up by the tool 20 and engagement by the pick 15.

We have described a recessed susceptor pocket but, the invention is not so limited and applies to essentially any workpiece or wafer support arrangement using peripheral tabs, pins, etc., to position the workpiece on an associated support.

Having thus described a preferred and alternative embodiments of my invention, what is claimed is:

1. A wafer handling tool, comprising: an elongated handle having first and second ends; the first end of said handle comprising a first, elongated end member having a transverse end surface angled forwardly and having a notch adjacent said end surface approximately two to three millimeter deep defining said front end surface into a thin flat hook for engaging a wafer by the end thereof; and the second end of said handle comprising a generally conical, elongated member terminating in a point for engaging a wafer.

2. The wafer handling tool of claim 1, wherein the handle is made of aluminum and the hook member and the pointed member are made of polyimid.

3. The wafer handling tool of claim 1, wherein the hook member and the pointed member are adapted for releasable attachment to said handle.

4. The wafer handling tool of claim 3, wherein the handle is made of aluminum and the hook member and the pointed member are made of polyimid.

5. A method of unloading a flat workpiece from a support such as a susceptor or electrode, comprising: providing an elongated tool having a thin flat hook at one end thereof and an adjacent notch; hooking the notch over the edge of a workpiece positioned on the support to position the hook between the workpiece and the support; lifting the wafer slightly away from the support; inserting workpiece-engaging means between the support and the workpiece and into gripping engagement with the backside of the workpiece; and, using the workpiece-engaging means, lifting the workpiece from the support.

6. The wafer unloading method of claim 5, wherein the support holds the workpiece in a generally vertical orientation.

7. The workpiece unloading method of claim 5, wherein the workpiece is a semiconductor wafer and the support is the pocket of a susceptor.

8. The wafer unloading method of claim 7, wherein the support holds the workpiece in a generally vertical orientation.

9. The workpiece unloading method of claim 5, wherein the support holds the workpiece in a generally vertical orientation and the workpiece is engaged by the notched tool proximate the upper edge of the workpiece and is pivoted away from the support using the opposite edge of a pivot point to permit insertion of the notched workpiece-engaging tool over the edge and between the workpiece and support.

10. The workpiece unloading method of claim 9, wherein the workpiece is a semiconductor wafer and the support is the pocket of a susceptor.

11. The workpiece unloading method of claim 9, wherein the workpiece-engaging tool is a vacuum pick.

12. The workpiece unloading method of claim 11, wherein the workpiece is a semiconductor wafer and the support is the pocket of a susceptor.

13. A method for loading and unloading a wafer at a generally vertical wafer-support pocket of a susceptor, comprising:
   providing an elongated tool having a first pointed end and having a second end comprising a flat end hook and an adjacent notch;
   picking up the wafer by engaging a vacuum pick against the back or non-integrated circuit side of the wafer and loading the wafer into the pocket by positioning the bottom of the wafer into the pocket, pushing the pointed end of the tool against the front bottom front edge of the wafer and releasing the top side of the wafer into the pocket; and
   unloading the wafer from the pocket by engaging the notch of the tool over the top edge of the wafer with the hook between the wafer and the pocket; pivoting the wafer about the bottom thereof to displace the top edge from the pocket; inserting a vacuum pick between the wafer and the pocket and grippingly engaging the wafer backside with the pick; and lifting the wafer from the pocket.

* * * * *